(12) United States Patent
Tsuji et al.

(10) Patent No.: US 10,892,146 B2
(45) Date of Patent: Jan. 12, 2021

(54) ENDPOINT DETECTING METHOD AND ENDPOINT DETECTING APPARATUS

(71) Applicant: Tokyo Electron Limited, Tokyo (JP)

(72) Inventors: Hiroki Tsuji, Hillsboro, OR (US); Itaru Tanaka, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/564,043

(22) Filed: Sep. 9, 2019

(65) Prior Publication Data

US 2020/0126775 A1 Apr. 23, 2020

(30) Foreign Application Priority Data

Oct. 18, 2018 (JP) .................... 2018-197044

(51) Int. Cl.
| | | |
|---|---|---|
| *G01N 21/00* | (2006.01) | |
| *H01J 37/32* | (2006.01) | |
| *G01J 3/443* | (2006.01) | |
| *H01L 21/67* | (2006.01) | |
| *H01L 21/311* | (2006.01) | |
| *H01L 21/02* | (2006.01) | |

(52) U.S. Cl.
CPC ......... *H01J 37/32963* (2013.01); *G01J 3/443* (2013.01); *H01J 37/32972* (2013.01); *H01L 21/02115* (2013.01); *H01L 21/02164* (2013.01); *H01L 21/31116* (2013.01); *H01L 21/31138* (2013.01); *H01L 21/67253* (2013.01); *H01J 2237/334* (2013.01)

(58) Field of Classification Search
CPC ......... G01N 21/73; G01N 21/68; G01J 3/443; H01J 49/105; H05H 1/30
USPC ........................................................ 356/316
See application file for complete search history.

(56) References Cited

U.S. PATENT DOCUMENTS

| | | | | |
|---|---|---|---|---|
| 2004/0045933 | A1* | 3/2004 | Kaji .................. | H01J 37/32935 216/59 |
| 2017/0140905 | A1* | 5/2017 | Mihaylov ......... | H01J 37/32972 |
| 2017/0287791 | A1* | 10/2017 | Coppa ..................... | H01L 22/12 |
| 2018/0271413 | A1* | 9/2018 | Chaum .................. | A61B 5/053 |

FOREIGN PATENT DOCUMENTS

JP     2001-250812     9/2001

\* cited by examiner

*Primary Examiner* — Md M Rahman
(74) *Attorney, Agent, or Firm* — IPUSA, PLLC

(57) ABSTRACT

A method of detecting an endpoint of a plasma process applied to a substrate is provided. The method includes: monitoring a time series of intensity of a predetermined wavelength component in an emission spectrum obtained by optical emission spectroscopy; monitoring a time series of intensity of a predetermined component in a mass spectrum obtained by mass spectrometry; calculating a signal used for detecting the endpoint of the plasma process by performing an arithmetic operation using the monitored time series of intensity of the predetermined wavelength component in the emission spectrum and the monitored time series of intensity of the predetermined component in the mass spectrum; and detecting the endpoint of the plasma process based on the signal calculated by the arithmetic operation.

6 Claims, 11 Drawing Sheets

S/N = (Signal Average Difference)/(Noise)

FIG.6

| ETCHING OF CARBON FILM | | | |
|---|---|---|---|
| | OES | QMS | OES × QMS |
| Signal | 11% | 88% | 89% |
| S/N | 16.7 | 84.2 | 96.7 |
| ETCHING OF SILICON OXIDE FILM | | | |
| | OES | QMS | OES × QMS |
| Signal | 38% | 33% | 59% |
| S/N | 44.3 | 21.0 | 83.5 |

ENDPOINT DETECTING METHOD AND ENDPOINT DETECTING APPARATUS

CROSS-REFERENCE TO RELATED APPLICATIONS

This patent application is based on and claims priority to Japanese Patent Application No. 2018-197044 filed on Oct. 18, 2018, the entire contents of which are incorporated herein by reference.

TECHNICAL FIELD

The present disclosure relates to an endpoint detecting method and an endpoint detecting apparatus.

BACKGROUND

In a method of detecting an endpoint using an optical emission spectroscopy, when a recess with a low aperture ratio formed on a film is to be plasma etched, because a signal to noise ratio (S/N) of a signal of a target wavelength to be detected is high, detecting a change in signal may be difficult. As a result, it becomes difficult to detect the endpoint stably at a high S/N.

In an endpoint detecting method disclosed in Patent Document 1, a plasma etching process is monitored by using a mass spectrometer and an optical emission spectrometer. If both of these spectrometers detect endpoints, it is determined that an appropriate endpoint of the plasma etching process has been detected.

CITATION LIST

Patent Document

[Patent Document 1] Japanese Laid-open Patent Application Publication No. 2001-250812

SUMMARY

According to an aspect of the present disclosure, a method of detecting an endpoint of a plasma process applied to a substrate is provided. The method includes: monitoring a time series of intensity of a predetermined wavelength component in an emission spectrum obtained by optical emission spectroscopy; monitoring a time series of intensity of a predetermined component in a mass spectrum obtained by mass spectrometry; calculating a signal used for detecting the endpoint of the plasma process by performing an arithmetic operation using the monitored time series of intensity of the predetermined wavelength component in the emission spectrum and the monitored time series of intensity of the predetermined component in the mass spectrum; and detecting the endpoint of the plasma process based on the signal calculated by the arithmetic operation.

BRIEF DESCRIPTION OF THE DRAWINGS

FIG. 6 is a diagram illustrating an example of S/N improved by a method according to the embodiment;

DETAILED DESCRIPTION OF EMBODIMENTS

In the following, embodiments of the present disclosure will be described with reference to the drawings. Note that in the following descriptions and the drawings, elements having substantially identical features are given the same reference symbols and overlapping descriptions may be omitted.

[Overall Structure of Plasma Processing Apparatus]

Figure 1:
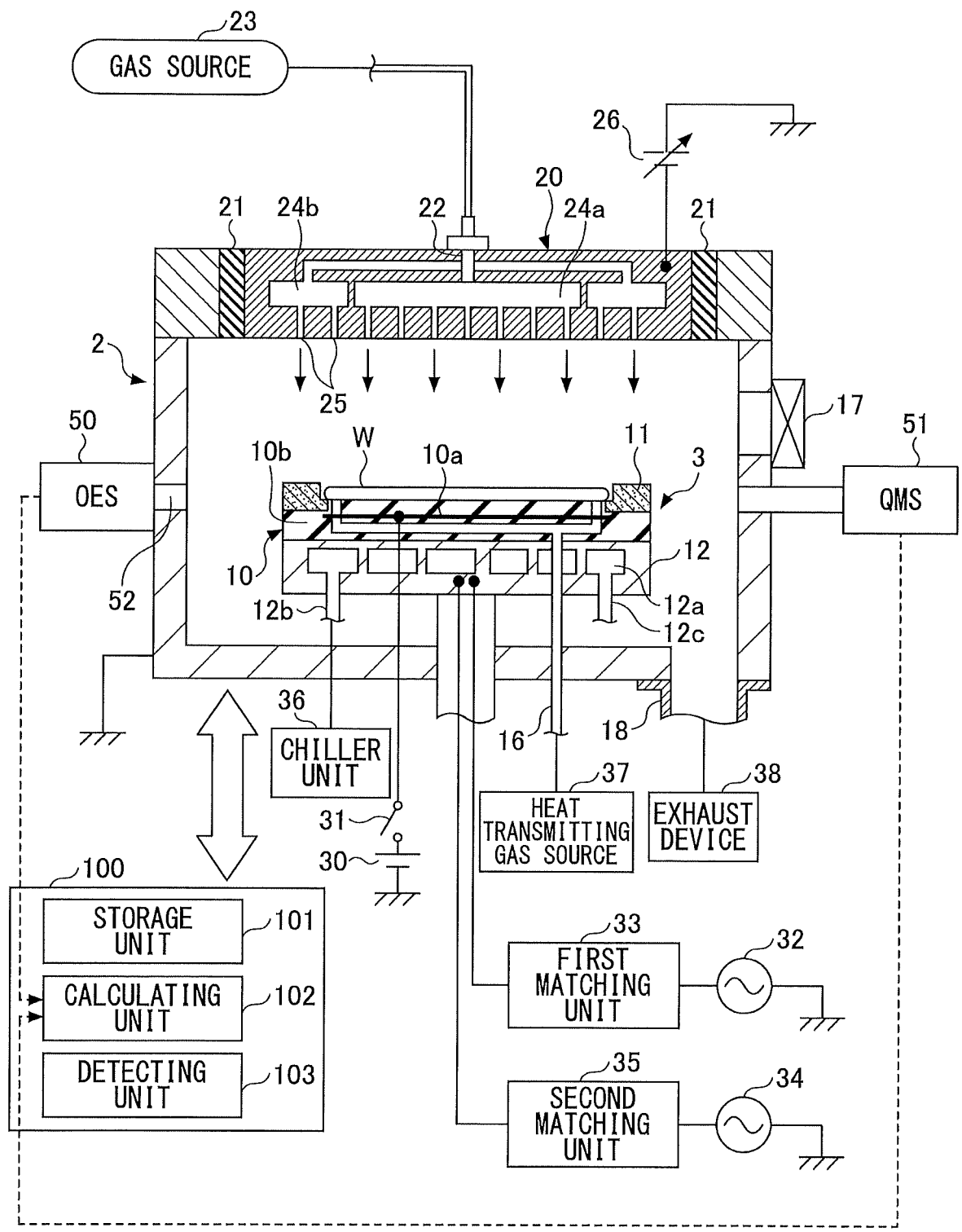
FIG. 1 is a diagram illustrating a plasma processing apparatus according to an embodiment.

First, an example of a plasma processing apparatus 1 will be described with reference to FIG. 1. The plasma processing apparatus 1 according to this embodiment is a capacitively coupled parallel plate plasma processing apparatus, and includes a substantially cylindrical processing vessel 2. To an inner surface of the processing vessel 2, anodic oxidation treatment is applied. The interior of the processing vessel 2 is a process chamber in which a plasma process, such as an etching process or a film deposition process, is performed by a plasma.

A stage 3 is used for placing a semiconductor wafer (hereinafter referred to as a "wafer") which is an example of a substrate. The stage 3 is formed of, for example, aluminum (Al), titanium (Ti), silicon carbide (SiC), or the like. The stage 3 also functions as a lower electrode.

On an upper side of the stage 3, an electrostatic chuck (ESC) 10 for attracting the wafer W electrostatically is provided. The electrostatic chuck 10 is configured such that a chuck electrode 10*a* is embedded in an insulator 10*b*. A direct current (DC) power supply 30 is connected to the chuck electrode 10*a* via a switch 31. When DC voltage is applied from the DC power supply 30 to the chuck electrode 10*a* by turning on the switch 31, the wafer W is attracted to the electrostatic chuck 10 by Coulomb force.

An annular edge ring 11 (also referred to as a focus ring) is disposed around the electrostatic chuck 10 so as to surround an outer periphery of the wafer W. The edge ring 11 is formed, for example, of silicon, and functions in the processing vessel 2 to cause a plasma to converge toward a surface of the wafer W, in order to improve efficiency of a plasma process.

A lower side of the stage 3 is a support 12, which holds the stage 3 at the bottom of the processing vessel 2. A coolant passage 12a is formed within the support 12. A cooling medium (hereinafter, also referred to as "coolant") such as cooling water or brine, which is output from a chiller unit 36, flows through a coolant inlet pipe 12b, the coolant passage 12a, and a coolant outlet pipe 12c, and circulates. The coolant circulating in such a manner removes heat from the stage 3 made of metal, and cools the stage 3.

A heat transmitting gas source 37 supplies heat transmitting gas such as helium gas (He) through a heat transmitting gas supply line 16 between an upper surface of the electrostatic chuck 10 and the back surface of the wafer W. Accordingly, a temperature of the electrostatic chuck 10 is controlled by the coolant circulating in the coolant passage 12a and the heat transmitting gas supplied to the back surface of the wafer W. As a result, the wafer W can be maintained at a predetermined temperature.

A first radio frequency power supply 32 that supplies radio frequency power HF of a first frequency for plasma generation is connected to the stage 3 via a first matching unit 33. A second radio frequency power supply 34 that supplies radio frequency power LF of a second frequency for generating the bias voltage is connected to the stage 3 through a second matching unit 35. The first frequency may be, for example, 40 MHz. The second frequency is lower than the first frequency, and the second frequency may be, for example, 13.56 MHz. In the present embodiment, the radio frequency power HF is applied to the stage 3, but may be applied to a gas showerhead 20.

The first matching unit 33 is for matching a load impedance and an internal impedance (or output impedance) of the first radio frequency power supply 32. The second matching unit 35 is for matching a load impedance and an internal impedance (or output impedance) of the second radio frequency power supply 34. The first matching unit 33 functions such that the internal impedance and the load impedance of the first radio frequency power supply 32 apparently coincide when a plasma is generated in the processing vessel 2. The second matching unit 35 functions such that the internal impedance and the load impedance of the second radio frequency power supply 34 apparently coincide when a plasma is generated in the processing vessel 2.

The gas showerhead 20 is attached to an opening of a ceiling of the processing vessel 2 via a shield ring 21 covering an outer edge of the gas showerhead 20, such that the gas showerhead 20 occludes the opening. A variable DC power supply 26 is connected to the gas showerhead 20, and negative DC voltage is output from the variable DC power supply 26. The gas showerhead 20 may be formed of silicon. The gas showerhead 20 also functions as a counter electrode (upper electrode) facing the stage 3 (lower electrode).

A gas inlet 22 for introducing gas is formed at the gas showerhead 20. Inside the gas showerhead 20, a diffusion chamber 24a located at the center portion of the gas showerhead 20 and a diffusion chamber 24b located at the edge side of the gas showerhead 20 are provided, and each of the diffusion chamber 24a and the diffusion chamber 24b is connected to the gas inlet 22. The gas output from a gas source 23 is supplied to the diffusion chambers 24a and 24b via the gas inlet 22, diffuses in the diffusion chambers 24a and 24b, and is introduced from multiple gas holes 25 to the stage 3.

An exhaust port 18 is formed at the bottom surface of the processing vessel 2, and the inside of the processing vessel 2 is evacuated by an exhaust device 38 connected to the exhaust port 18. This allows the inside of the processing vessel 2 to be maintained in a predetermined quality of vacuum. A gate valve 17 is provided at a side wall of the processing vessel 2. The gate valve 17 opens and closes when the wafer W is loaded into the processing vessel 2 or when the wafer W is unloaded from the processing vessel 2.

An optical emission spectrometer 50 (may also be referred to as an "OES 50") monitors the change in intensity of a predetermined wavelength component in an optical spectrum of plasma light, by optical emission spectroscopy. The OES 50 is disposed at the side wall of the processing vessel 2 adjacent to a window 52 for plasma light acquisition. Through the window 52, the OES 50 monitors changes in intensity of a wavelength component corresponding to a particular active species during a plasma process.

A mass spectrometer 51 (may also be referred to as a "QMS 51") monitors change in intensity of a given component in a mass spectrum, by mass spectrometry. The mass spectrometer 51 is disposed adjacent the side wall of the processing vessel 2, to monitor the change in intensity of a given component of a mass spectrum of gas in the processing vessel 2 during a plasma process.

A set of the OES 50, the mass spectrometer 51, and a controller 100 is an example of an endpoint detecting apparatus. In the present embodiment, a single OES 50 and a single QMS 51 are provided, but not limited thereto. For example, multiple OES's 50 and multiples QMS's 51 may be used for monitoring, and endpoint detection may be performed using the monitoring results obtained from the multiple OES's 50 and the multiple QMS's 51.

The plasma processing apparatus 1 is equipped with the controller 100 that controls an entire operation of the apparatus. The controller 100 includes multiple functional units: a storage unit 101, a calculating unit 102, and a detecting unit 103. The storage unit 101 stores a program and data for endpoint detection. The calculating unit 102 performs an arithmetic operation using a time series of intensity of a component in an emission spectrum monitored by the OES 50 and a time series of intensity of a component in a mass spectrum monitored by the QMS 51. The detecting unit 103 detects an endpoint of a plasma process based on a signal calculated based on the arithmetic operation performed by the calculating unit 102.

A hardware configuration of the controller 100 will be described. The controller 100 includes a CPU, a ROM, and a RAM. The CPU performs a plasma etching process and other desired plasma processes according to a recipe stored in a storage area, such as a RAM.

The recipe may include control information of the plasma processing apparatus corresponding to a process condition of a plasma process, such as a process time, pressure (gas exhaust), power or voltage of the radio frequency power supply, and a flowrate of each gas. The recipe may also include a temperature in the processing vessel (such as a temperature of the upper electrode, a temperature of the side wall of the processing vessel, a temperature of the wafer W, and a temperature of the electrostatic chuck), a temperature of coolant output from the chiller, and the like. The recipe may be stored in a hard disk drive or a semiconductor memory. The recipe may also be stored in a computer-readable removable recording medium such as a CD-ROM or a DVD, and the removable recording medium may be loaded in a predetermined location in an accessible state.

When a plasma process is performed, the opening and closing of the gate valve 17 is controlled so that the wafer W is loaded into the processing vessel 2 and is placed on the stage 3. When DC voltage of positive or negative polarity is applied from the DC power supply 30 to the chuck electrode 10a, the wafer W is attracted and held to the electrostatic chuck 10.

Desired gas is supplied from the gas source 23 into the processing vessel 2, through the gas showerhead 20. The radio frequency power HF is applied from the first radio frequency power supply 32 to the stage 3, and the radio frequency power LF is applied from the second radio frequency power supply 34 to the stage 3. Negative DC voltage is applied from the variable DC power supply 26 to the gas showerhead 20. As a result, the gas is dissociated and a plasma is generated above the wafer W. Further, by an effect of the plasma, plasma treatment is applied to the wafer W.

Intensity of a predetermined wavelength component in an emission spectrum monitored by the OES 50 is transmitted to the controller 100.

Similarly, intensity of a predetermined component in a mass spectrum monitored by the QMS 51 is transmitted to the controller 100. The controller 100 performs an arithmetic operation (the arithmetic operation in the present embodiment is multiplication) using the intensity of the predetermined wavelength component in the emission spectrum and the intensity of the predetermined component in the mass spectrum. In the following description, information obtained as a result of the arithmetic operation performed by the controller 100 may be referred to as a "signal". The controller 100 detects an endpoint of a plasma process based on the signal obtained by the arithmetic operation.

After the plasma process, DC voltage having an opposite polarity to the polarity when the wafer W is attracted is applied from the DC power supply 30 to the chuck electrode 10a, to remove electrical charge on the wafer W. After electrical charge is removed, the wafer W is removed from the electrostatic chuck 10, and is unloaded from the gate valve 17 to an outside of the processing vessel 2.

[Types of Films]

Figure 2:
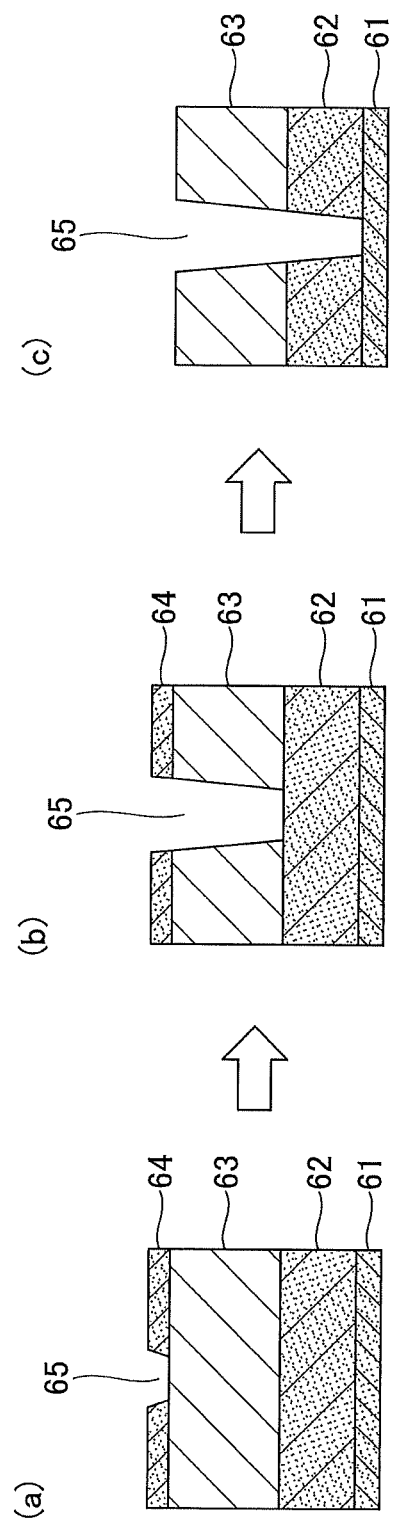
FIG. 2 is a diagram illustrating a multilayered film according to the embodiment.

A film to which a plasma process is applied is formed on the wafer W. More than one film to which a plasma process is applied may be formed on the wafer W. FIG. 2 illustrates an example of a multilayered film formed on the wafer W.

As illustrated in a diagram (a) of FIG. 2, on the wafer W, a multilayered film is formed, in which a silicon nitride film 61 (SiN), a silicon oxide film 62, a carbon film 63, and an antireflection film 64 are layered in order from the bottom. An opening 65 of a predetermined pattern is formed on the antireflection film 64.

During the plasma process, the carbon film 63 is etched with a pattern of the opening 65 (diagram (b) in FIG. 2), and the silicon oxide film 62 which is the underlying layer of the carbon film 63 is etched (diagram (c) in FIG. 2). In the multilayered film having the aforementioned structure, the carbon film 63 and the silicon oxide film 62 are films to be etched, and an endpoint of the plasma process is detected for each of the films to be etched. Note that, in the following description, a film (or films) to be etched may also be referred to as an "etching target film".

In such a multilayered film with a low aperture ratio in which the carbon film 63 and the silicon oxide film 62 are layered, there may be a problem of a deterioration of a yield rate caused by an etching defect of an opening. In contrast, if a time for the etching process is increased so as not to cause an etching defect of an opening, shapes of the lower layer and the mask may be damaged, making it difficult to make a shape of an opening and the like according to a desired dimension. In addition, because a thickness of each film differs in a multilayered film structure in which multiple films to be processed are formed, it is necessary to appropriately detect an endpoint of a plasma process of each film for each wafer W.

In a conventional endpoint detecting method using only an OES 50 or only a QMS 51, it is difficult to detect a change in an emission spectrum or a change in a mass spectrum, with respect to a small area of a low aperture ratio in the carbon film 63 or the silicon oxide film 62. Therefore, it is difficult to detect an endpoint stably at high S/N.

Accordingly, in the present embodiment, even in a case in which detecting an endpoint is difficult based on information monitored by only the OES 50 or based on information monitored by only the QMS 51 because of noise, by performing an arithmetic operation using intensity of a wavelength component in an emission spectrum and intensity of a component in a mass spectrum, S/N is improved. Thus, even in a case of etching of a recess with a low aperture ratio that is formed on a multilayered film, it is possible to stably detect an endpoint of a plasma process.

When a film to be etched disappears on a surface of a wafer W by a plasma process, intensity of a predetermined wavelength component in an emission spectrum changes. Similarly, when the film disappears on the surface of the wafer W by the plasma process, intensity of a component in a mass spectrum, which corresponds to a predetermined gas component contained in a by-product of etching, also changes. Thus, in order to detect an endpoint of a film to be etched, a change in intensity of a predetermined wavelength component in an emission spectrum, and a change in intensity of a component in a mass spectrum that corresponds to a predetermined gas component contained in a by-product of etching, are respectively monitored by the OES 50 and the QMS 51. Accordingly, based on a change in intensity of a component in an emission spectrum and of a component in a mass spectrum, an endpoint of a plasma processing with respect to a film to be etched can be detected.

For example, when the carbon film 63 is to be etched, $H_2$ gas and $N_2$ gas are supplied, as gases for generating a plasma, into the processing vessel 2, and CN and $H_2$ are produced as by-products while the carbon film 63 is etched. Thus, during etching of the carbon film 63, a component in an emission spectrum of plasma that corresponds to CN (wavelength $\lambda$=387 nm) is monitored by the OES 50. At the same time, among by-products of the etching, a component corresponding to $H_2$ (mass 2) in the mass spectrum is monitored by the QMS 51.

When the silicon oxide film 62 is to be etched, a CF-based gas (fluorocarbon gas), such as $C_4F_8$ gas and $C_4F_6$ gas, is supplied as a gas for generating a plasma, and CO is produced as a by-product during etching of the silicon oxide film 62. Thus, during the etching of the silicon oxide film 62, a component in an emission spectrum of plasma that corresponds to SiF (wavelength $\lambda$=440 nm) is monitored by the OES 50. At the same time, among by-products of the etching, a component corresponding to CO (mass 28) in the mass spectrum is monitored by the QMS 51.

First Embodiment

Figure 3A:
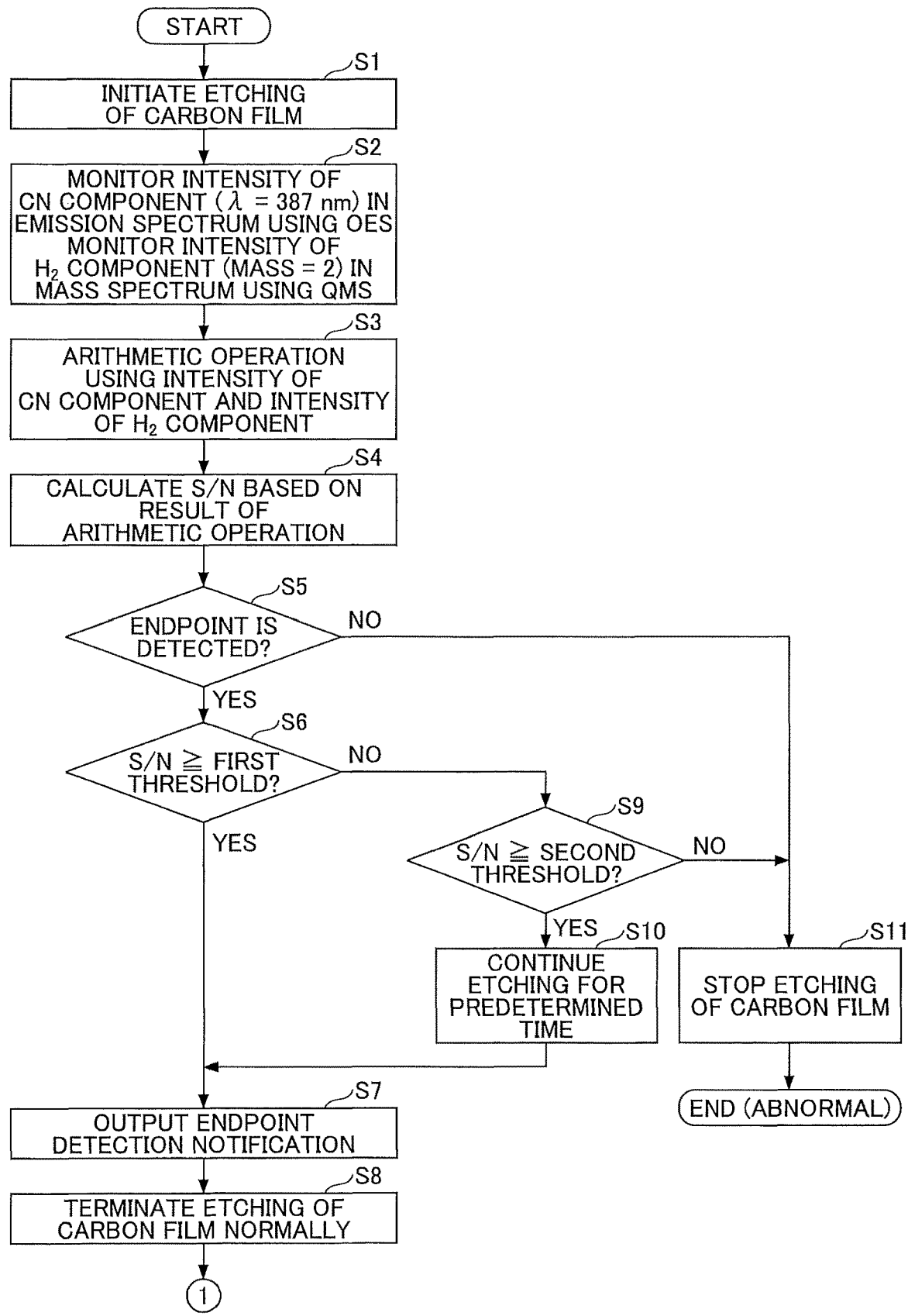
FIGS. 3A and 3B are flowcharts illustrating an endpoint detecting process of a carbon film and an endpoint detecting process of a silicon oxide film according to a first embodiment.
Figure 3B:
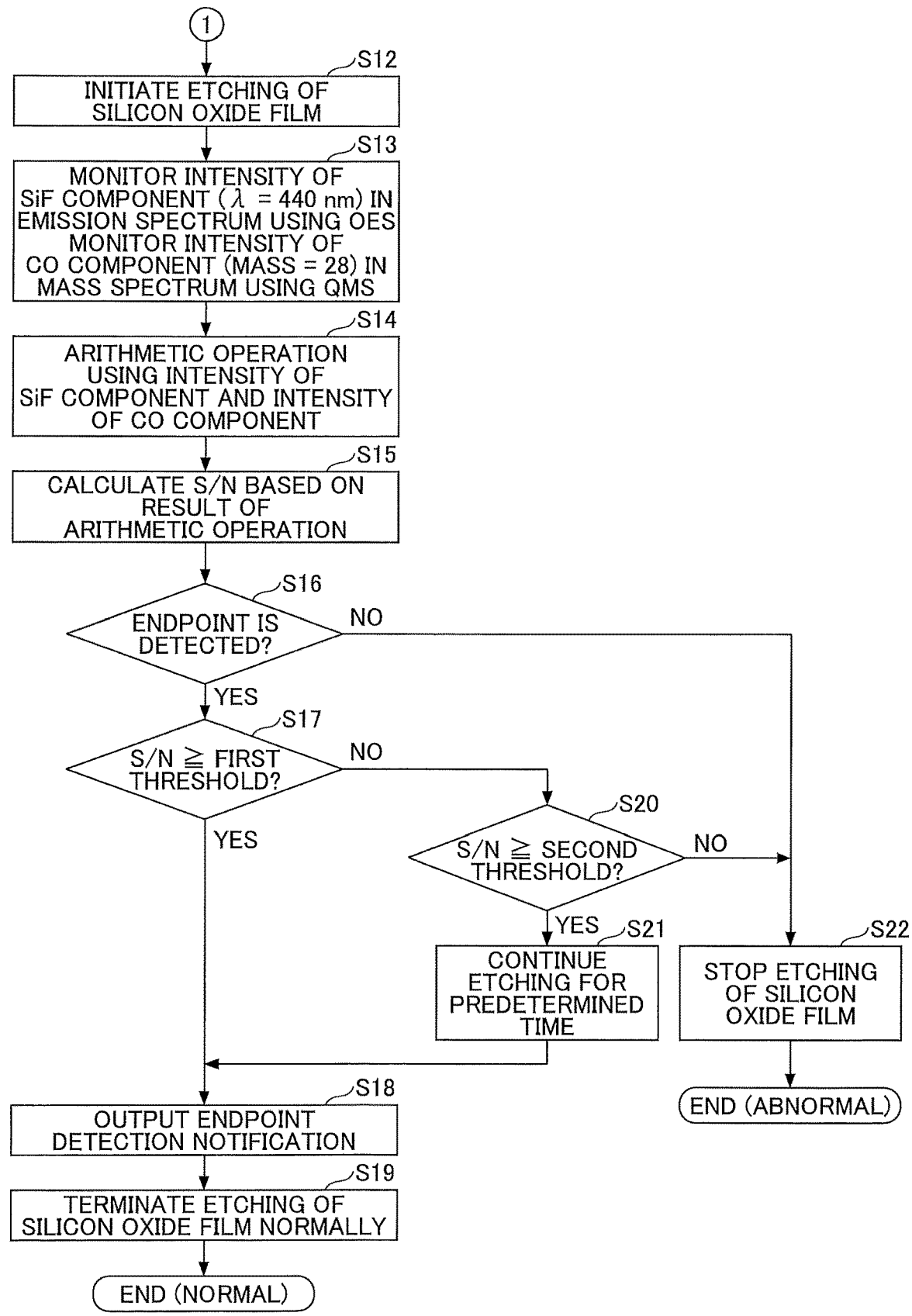

Hereinafter, the endpoint detecting method according to the first embodiment will be described with reference to flowcharts of an endpoint detecting process illustrated in FIGS. 3A and 3B, in which a multilayered film of the carbon film 63 and the silicon oxide film 62 illustrated in the diagram (a) of FIG. 2 is used as an etching target film. FIG. 3A is a flowchart illustrating an endpoint detecting process of a carbon film according to the first embodiment. FIG. 3B is a flowchart illustrating an endpoint detecting process of a silicon oxide film according to the first embodiment.

[Endpoint Detection]

A method of detecting an endpoint of a plasma processing according to the first embodiment is performed by the CPU in the controller 100 executing a program for endpoint detection stored in the storage unit 101 based on an emission spectrum monitored by the OES 50 and a mass spectrum monitored by the QMS 51. At this time, the CPU functions as the calculating unit 102 and the detecting unit 103.

Specifically, when the endpoint detecting process of FIG. 3A is started, a plasma etching process of the carbon film 63 is started (step S1). This etches the carbon film 63 in a pattern of the opening 65 on the antireflection film 64.

Next, intensity of a wavelength component in an emission spectrum corresponding to CN (wavelength $\lambda=387$ nm) is monitored by the OES 50 (step S2). Also, the QMS 51 monitors intensity of a component in the mass spectrum corresponding to $H_2$ (mass 2) (step S2). The monitored intensity of the wavelength component of CN in the emission spectrum, and the monitored intensity of the component of $H_2$ in the mass spectrum, are transmitted to the controller 100.

Figure 4A:
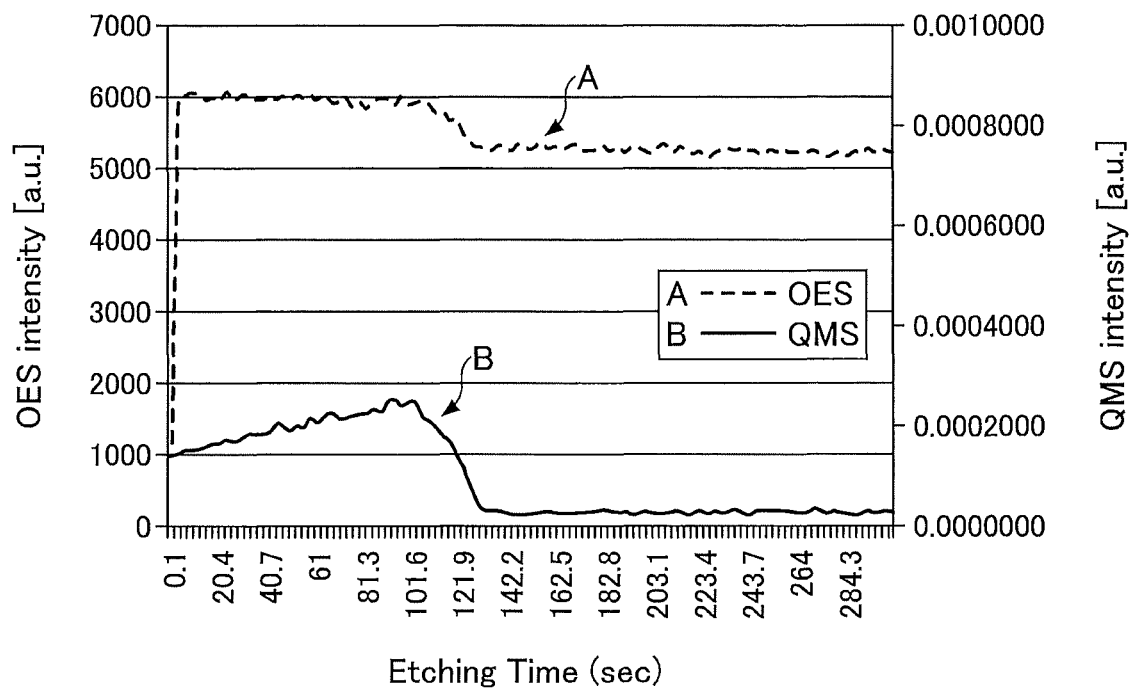
FIG. 4A is a diagram illustrating a result of monitoring a component of an emission spectrum and a component of a mass spectrum that are obtained when the carbon film according to the embodiment is etched.

FIG. 4A illustrates an example of a time series of intensity (OES intensity) of the wavelength component of CN in the emission spectrum monitored by the OES 50 during etching of the carbon film 63 (this may also be referred to as a signal A), and an example of time series of intensity (QMS intensity) of a component of $H_2$ in the mass spectrum monitored by the QMS 51 during etching of the carbon film 63 (this may also be referred to as a signal B).

Figure 4B:
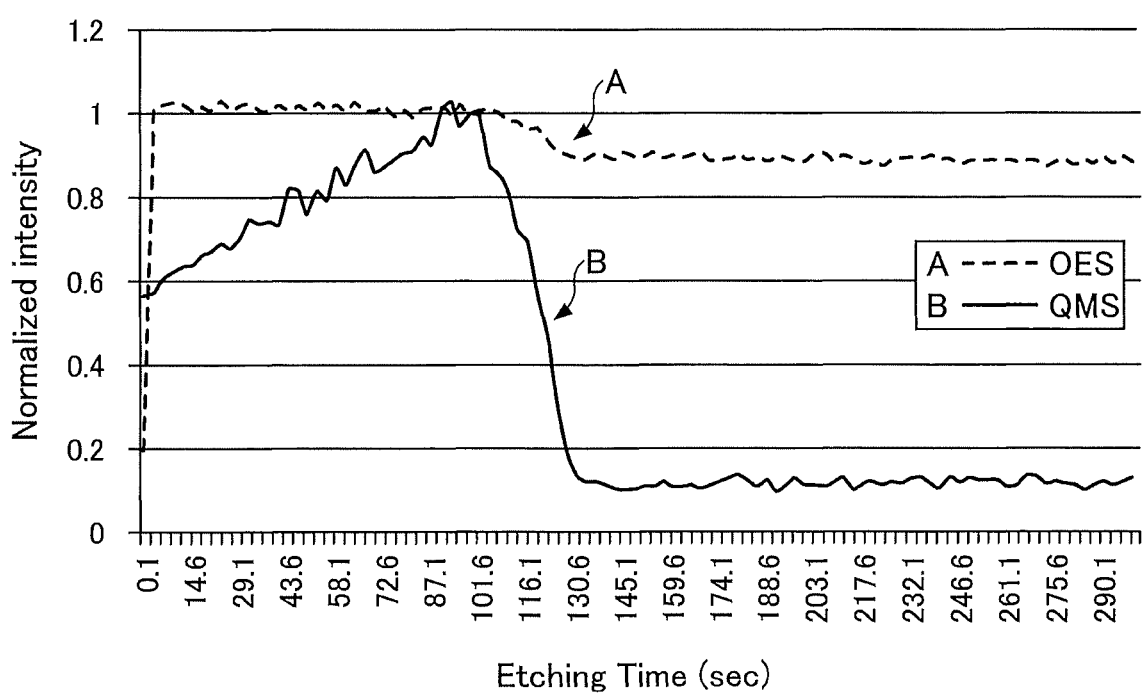
FIG. 4B is a diagram illustrating normalized waveforms of the monitored components.
Figure 4C:
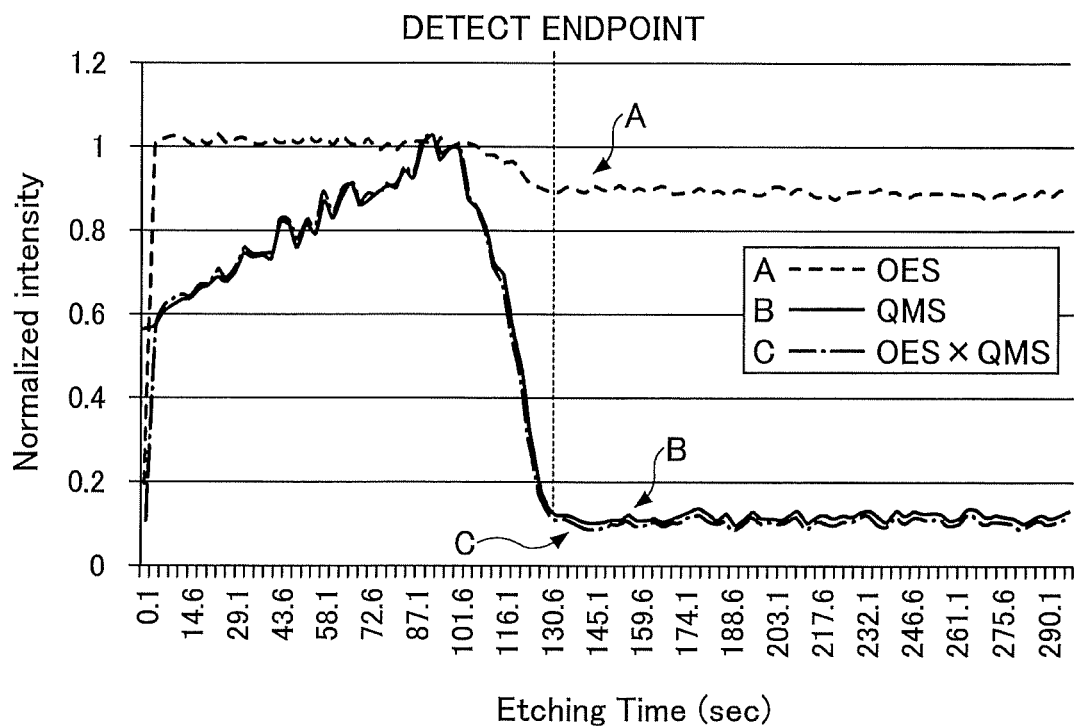
FIG. 4C is a diagram illustrating a result of an arithmetic operation using the monitored components.

Referring back to FIG. 3A, at step S3, the calculating unit 102 of the controller 100 performs an arithmetic operation using the intensity of the wavelength component of CN in the emission spectrum and the intensity of the component of $H_2$ in the mass spectrum. In the present embodiment, as an example of an arithmetic operation performed at step S3, multiplication is performed. Specifically, at each time, a product of the signal A (the intensity of the wavelength component of CN in the emission spectrum) and the signal B (the intensity of the component of $H_2$ in the mass spectrum) is calculated. In this case, as illustrated in FIG. 4B, it is preferable that the intensity of the signal A and the intensity of the signal B are normalized before performing multiplication. In the present embodiment, time series of the product obtained by performing the multiplication of the signals A and B is referred to as a signal C. An example of the signal C is illustrated in FIG. 4C. In this example, shapes of the signals B and C are almost the same.

The arithmetic operation at step S3 is not limited to multiplication of the signal A and the signal B. Instead, the arithmetic operation at step S3 may be any one of multiplication, division, addition, subtraction, or a combination of these operations. For example, if both the signals A and B are positive or negative, it is preferable to multiply them. For example, if one of the signals A and B is positive and the other one of the signals is negative, it is preferable to perform division of the signals. The signals A and B may be added or subtracted, or a combination of multiplication, division, addition, and subtraction may be applied to the signals A and B. By performing the arithmetic operation at step S3, the signal C can be calculated from signals A and B, and a signal to noise ratio of the signal C can be improved.

Figure 5:
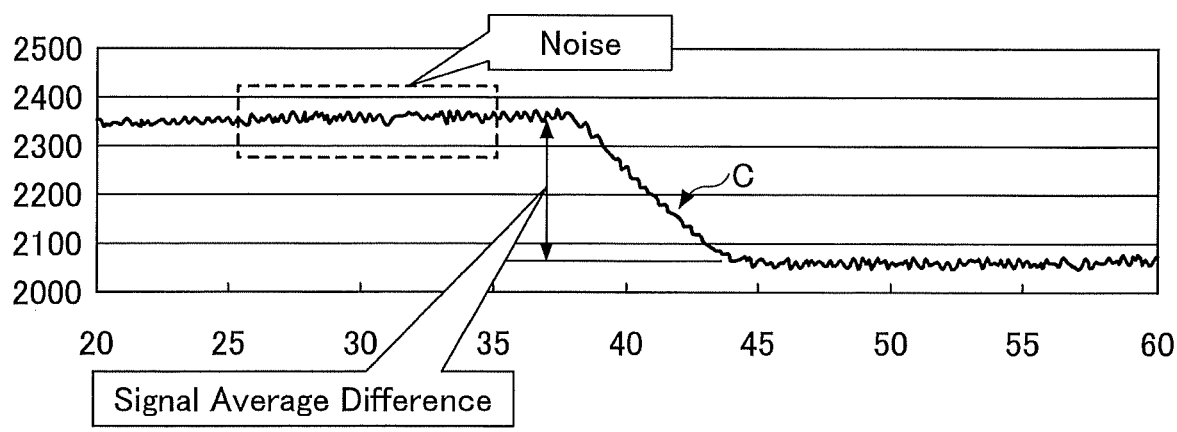
FIG. 5 is a diagram illustrating a method of calculating S/N.

Referring back to FIG. 3A, at step S4, the calculating unit 102 calculates S/N based on the signal (signal C) calculated by the arithmetic operation at step S3 (multiplication in the present embodiment). A calculation method of the S/N will be briefly described with reference to FIG. 5. FIG. 5 is an example of the signal C (=signal A×signal B) calculated by the arithmetic operation at step S3 by using the normalized signal A and the normalized signal B. However, the signal C illustrated in FIG. 5 is an example, and the signal C calculated by an arithmetic operation is not limited thereto.

The letter "S" in "S/N" represents "signal", and the signal "S" is, in the present embodiment, a difference between a maximum value of the signal C and a minimum value of the signal C (which corresponds to "Signal Average Difference" in FIG. 5). For example, "S" can be calculated as the difference between an average of the intensity of the signal C during a predetermined period of time (e.g., 10 seconds) before a change in intensity of the signal C occurs (that is, before an endpoint of the etching process), and an average of the intensity of the signal C during a predetermined period of time (e.g., 10 seconds) after the change in intensity of the signal C occurs. The letter "N" in "S/N" represents "noise", and the noise "N" is, in the present embodiment, a standard deviation of the intensity of the signal C during a predetermined period of time (e.g., 10 seconds) before the change in intensity of the signal C occurs. "S/N" is obtained by dividing the signal "S" by the noise "N". The noise "N" may be a standard deviation of the intensity of the signal C during a predetermined period of time (e.g., 10 seconds) after the change in intensity of the signal C occurs.

Through the above-described calculation, an example of the S/N of the signal C, which was obtained when the carbon film 63 was etched, was "96.7", as illustrated in FIG. 6. In this example, S/N Calculated from a time series of intensity of the wavelength component of CN in an emission spectrum monitored by optical emission spectroscopy was "16.7", and S/N calculated from a time series of intensity of a component of $H_2$ in a mass spectrum monitored by mass spectrometry was "84.2". As described above, in the method for detecting the endpoint of the carbon film 63 according to the present embodiment, S/N of the signal can be improved, as compared to S/N of a signal obtained by using only optical emission spectroscopy or by using only mass spectrometry, and accuracy of the endpoint detection can be improved.

Referring back to FIG. 3A, the detecting unit 103 then determines whether a sign of an endpoint has been obtained (step S5). Specifically, execution of steps S2 to S4 is repeated for a predetermined time. After the predetermined time, if an amount of change of the signal C becomes a prescribed amount or higher, the detecting unit 103 determines that the sign of the endpoint is obtained (may also be referred to as "the endpoint signal is obtained"), and the endpoint detecting process proceeds to step S6. If the amount of change of the signal C within the predetermined time is less than the prescribed amount, the detecting unit 103 determines that the endpoint signal was not obtained, and the endpoint detecting process proceeds to step S11.

At step S6, the detecting unit 103 determines whether or not the calculated S/N (calculated at step S4) is equal to or greater than a first threshold. The first threshold is a predetermined value and stored in the storage unit 101. The first threshold may be, for example, "80" or another value.

If it is determined that the calculated S/N is equal to or greater than the first threshold, the detecting unit 103 determines that accuracy of the endpoint detection is satisfied, and the detecting unit 103 outputs an endpoint detection notification (step S7). Then, the etching process of the carbon film 63 is terminated normally (step S8), and the endpoint detecting process proceeds to a process of etching the silicon oxide film 62 ((1) in FIGS. 3A and 3B means that the endpoint detecting process proceeds to step S12 and thereafter in FIG. 3B, after step S8 is performed).

Meanwhile, at step S6, if it is determined that the calculated S/N is less than the first threshold, the detecting unit 103 determines that accuracy of the endpoint detection is not satisfied, and determines whether or not the calculated S/N is equal to or greater than the second threshold (step S9). The second threshold is a predetermined value that is smaller than the first threshold, and is stored in the storage unit 101. The second threshold may be "50", for example, or may be another value less than the first threshold.

If it is determined that the calculated S/N is equal to or greater than the second threshold, the detecting unit 103 continues the etching process of the carbon film 63 for a predetermined period of time (step S10). After step S10, the detecting unit 103 outputs an endpoint detection notification (step S7), terminates the etching process of the carbon film 63 normally (step S8), and the endpoint detecting process proceeds to step S12 in FIG. 3B.

At step S9, if it is determined that the calculated S/N is less than the second threshold, the endpoint detecting process proceeds to step S11, stops the etching process of the carbon film 63, and the endpoint detecting process terminates abnormally. Subsequently, an analysis for the abnormal termination may be performed. Note that an execution order of each step is not limited to that described above. For example, the calculation of the S/N (step S4) may be performed after step S5 and before step S6.

Next, a flow of a process illustrated in FIG. 3B, which is an endpoint detecting process for the silicon oxide film 62, will be described. After detecting the endpoint of the plasma etching process of the carbon film 63, a plasma etching process of the silicon oxide film 62 under the carbon film 63 is started (step S12).

In the plasma etching of the silicon oxide film 62, intensity of a wavelength component in an emission spectrum corresponding to SiF (wavelength $\lambda=440$ nm), and intensity of a component in a mass spectrum corresponding to CO (mass 28) are monitored by the OES 50 and the QMS 51 (step S13). The monitored intensity of the wavelength component of SiF in the emission spectrum, and the monitored intensity of the component of CO in the mass spectrum, are transmitted to the controller 100.

Figure 7A:
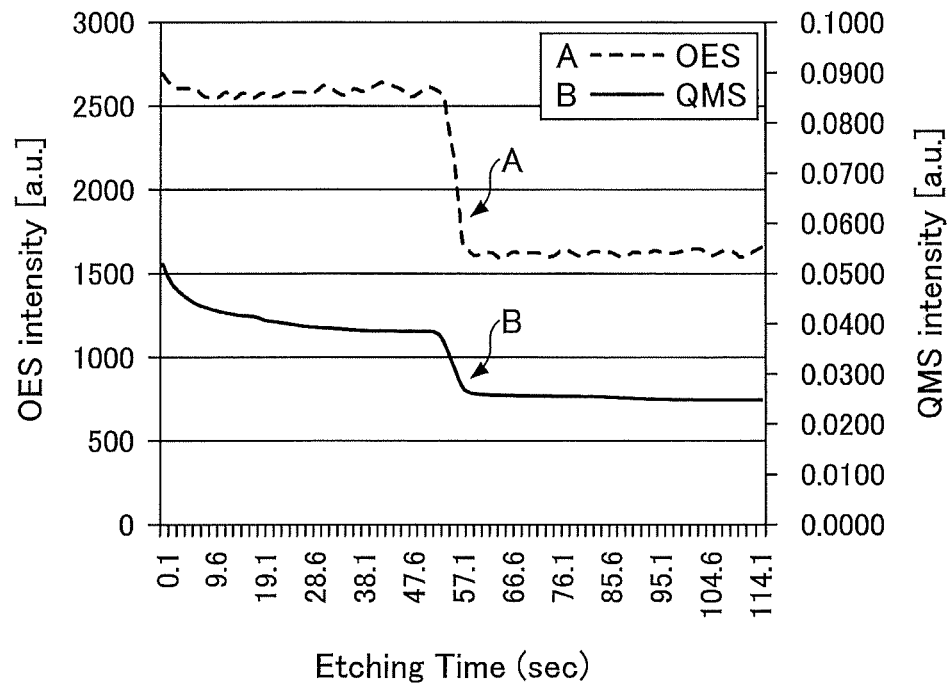
FIG. 7A is a diagram illustrating a result of monitoring a component of an emission spectrum and a component of a mass spectrum that are obtained when the silicon oxide film according to the embodiment is etched.

FIG. 7A illustrates a time series of intensity (OES intensity) of the wavelength component of the OES intensity of SiF in the emission spectrum monitored by the OES 50 during etching of the silicon oxide film 62 (this is referred to as a signal A), and a time series of intensity (QMS intensity) of a component of CO in the mass spectrum monitored by the QMS 51 during etching of the silicon oxide film 62 (this is referred to as a signal B).

Figure 7B:
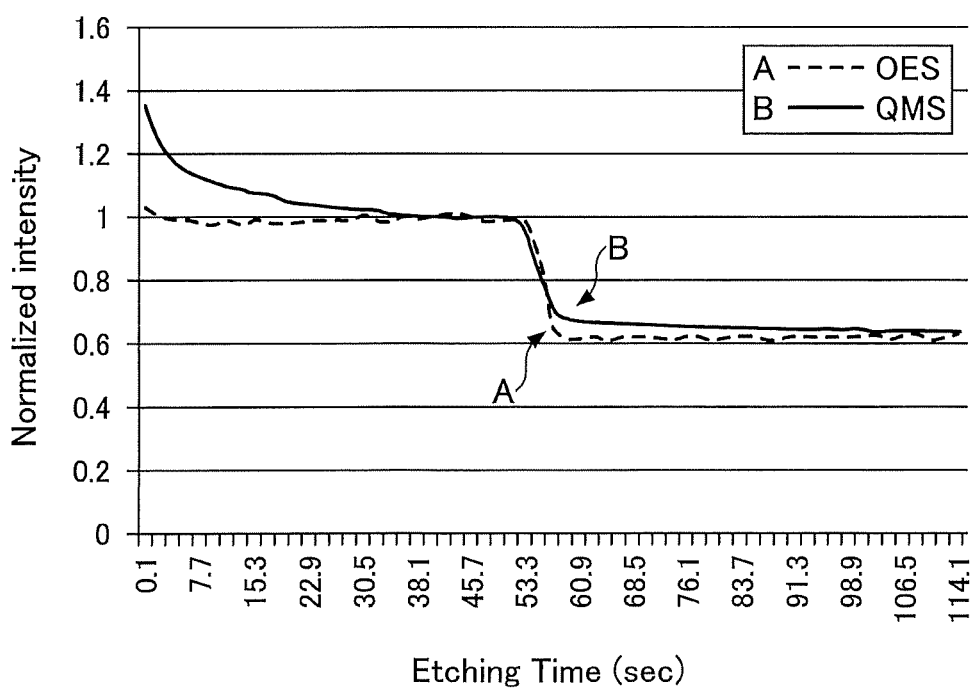
FIG. 7B is a diagram illustrating normalized waveforms of the monitored components.
Figure 7C:
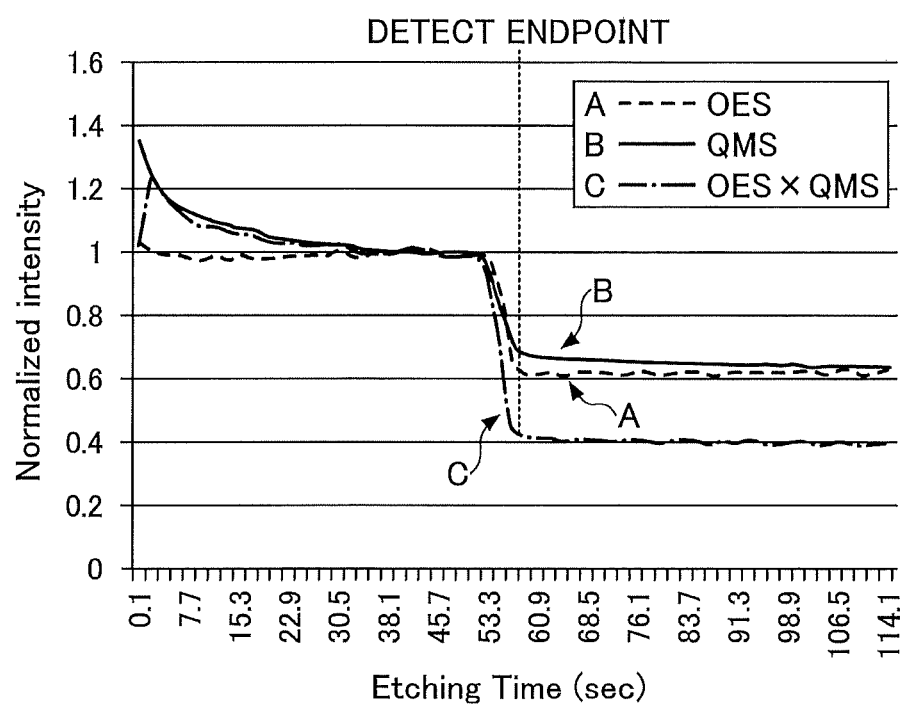
FIG. 7C is a diagram illustrating a result of an arithmetic operation using the monitored components.

Referring back to FIG. 3B, at step S14, the calculating unit 102 performs an arithmetic operation using the intensity of the wavelength component of SiF in the emission spectrum and the intensity of the component of CO in the mass spectrum. In the present embodiment, as an example of an arithmetic operation performed at step S14, multiplication is performed. Specifically, at each time, a product of the intensity of the signal A and the intensity of the signal B is calculated. In this case, as illustrated in FIG. 7B, it is preferable that the intensity of the signal A and the intensity of the signal B are normalized before performing multiplication. A result of the arithmetic operation (product of the intensity of the signals A and B; which is referred to as a signal C in the present embodiment) is illustrated in FIG. 7C.

Referring back to FIG. 3B, at step S15, the calculating unit 102 calculates S/N based on the signal (signal C) calculated by the arithmetic operation at step S14 (multiplication in the present embodiment). An example of the calculation result is illustrated in FIG. 6. As illustrated in FIG. 6, the S/N of the signal C, obtained when the silicon oxide film 62 was etched, was "83.5". S/N calculated from time series of intensity of the wavelength component of SiF in an emission spectrum monitored by optical emission spectroscopy (OES) was "44.3" and S/N calculated from time series of intensity of a component of CO in a mass spectrum monitored by mass spectrometry (QMS) was "21.0". As described above, in the present embodiment, S/N of the signal can be improved, as compared to S/N of a signal obtained by using only optical emission spectroscopy or by using only mass spectrometry, and accuracy of the endpoint detection can be improved.

Referring back to FIG. 3B, the detecting unit 103 then determines whether an endpoint signal has been obtained (step S16). If an amount of change of the signal C within a predetermined time is a prescribed amount or greater, the detecting unit 103 determines that an endpoint signal is obtained, and the endpoint detecting process proceeds to step S17. Meanwhile, if the amount of change of the signal C within the predetermined time is less than the prescribed amount, the detecting unit 103 determines that the endpoint signal was not obtained, and the endpoint detecting process proceeds to step S22.

At step S17, the detecting unit 103 determines whether or not the calculated S/N (calculated at step S15) is equal to or greater than a first threshold. If it is determined that the calculated S/N is equal to or greater than the first threshold, the detecting unit 103 outputs the endpoint detection notification (step S18), terminates the etching process of the silicon oxide film 62 normally (step S19), and the endpoint detecting process terminates.

Meanwhile, at step S17, if it is determined that the calculated S/N is less than the first threshold, the detecting unit 103 determines whether or not the calculated S/N is equal to or greater than a second threshold (step S20).

If it is determined that the calculated S/N is equal to or greater than the second threshold, the detecting unit 103 continues the etching process of the silicon oxide film 62 for a predetermined period of time (step S21), and outputs an endpoint detection notification (step S18). After step S18, the etching process of the silicon oxide film 62 is terminated normally (step S19), and the endpoint detecting process terminates.

At step S20, if it is determined that the calculated S/N is less than the second threshold, the endpoint detecting process proceeds to step S22, stops the etching process of the silicon oxide film 62, and the endpoint detecting process terminates abnormally. Analysis for abnormal termination may be performed. Note that an execution order of each step is not limited to that described above. For example, the calculation of the S/N (step S15) may be performed after step S16 and before step S17.

According to the endpoint detecting method of the first embodiment described above, S/N of a signal that is used for endpoint detection can be improved because a signal that is used for endpoint detection is based on a result of an arithmetic operation using two types of information, intensity of an emission spectrum and intensity of a mass spectrum. This can improve accuracy of endpoint detection of a plasma process. For example, as described in the present embodiment, by improving accuracy of detection of an endpoint with respect to a process of etching multiple films continuously, it is possible to avoid an etching defect of an opening, and etching of a multilayered film composed of different types of films can be performed stably and continuously.

Especially, in a case in which a multilayered film composed of different types of films is to be etched, because film thickness of each layer varies among wafers W, accuracy of endpoint detection tends to deteriorate due to the variation. However, the endpoint detecting method according to the present embodiment is excellent in that an endpoint can be detected with high accuracy even if multiple films are to be etched continuously.

In the endpoint detecting method according to the present embodiment, each of the aforementioned two techniques (optical emission spectroscopy and mass spectrometry) can compensate for a disadvantage of the other technique. For example, in a case in which plasma density is low, because emission intensity decreases, detecting a change in intensity by means of optical emission spectroscopy becomes difficult, and thereby endpoint detection becomes difficult. In contrast, accuracy of mass spectrometry depends on an amount of by-product (that is, etching rate) rather than plasma density. Thus, if an amount of a by-product decreases, detecting a change in intensity by means of mass spectrometry becomes difficult. Accuracy of endpoint detection by means of mass spectrometry also deteriorates in a case in which a desired by-product is included in a film of an underlying layer.

On the other hand, in the endpoint detecting method according to the present embodiment, an arithmetic operation (such as multiplication) using intensity of a component in an emission spectrum monitored by optical emission spectroscopy and intensity of a component in a mass spectrum monitored by mass spectrometry is performed, and endpoint detection is performed based on information (such as a signal C described above) obtained as a result of the arithmetic operation. Because S/N of the information is higher than that of information obtained by only optical emission spectroscopy or mass spectrometry, even in a case in which endpoint detection is difficult by only one of optical emission spectroscopy and mass spectrometry, endpoint detection can be performed stably.

Second Embodiment

Figure 8A:
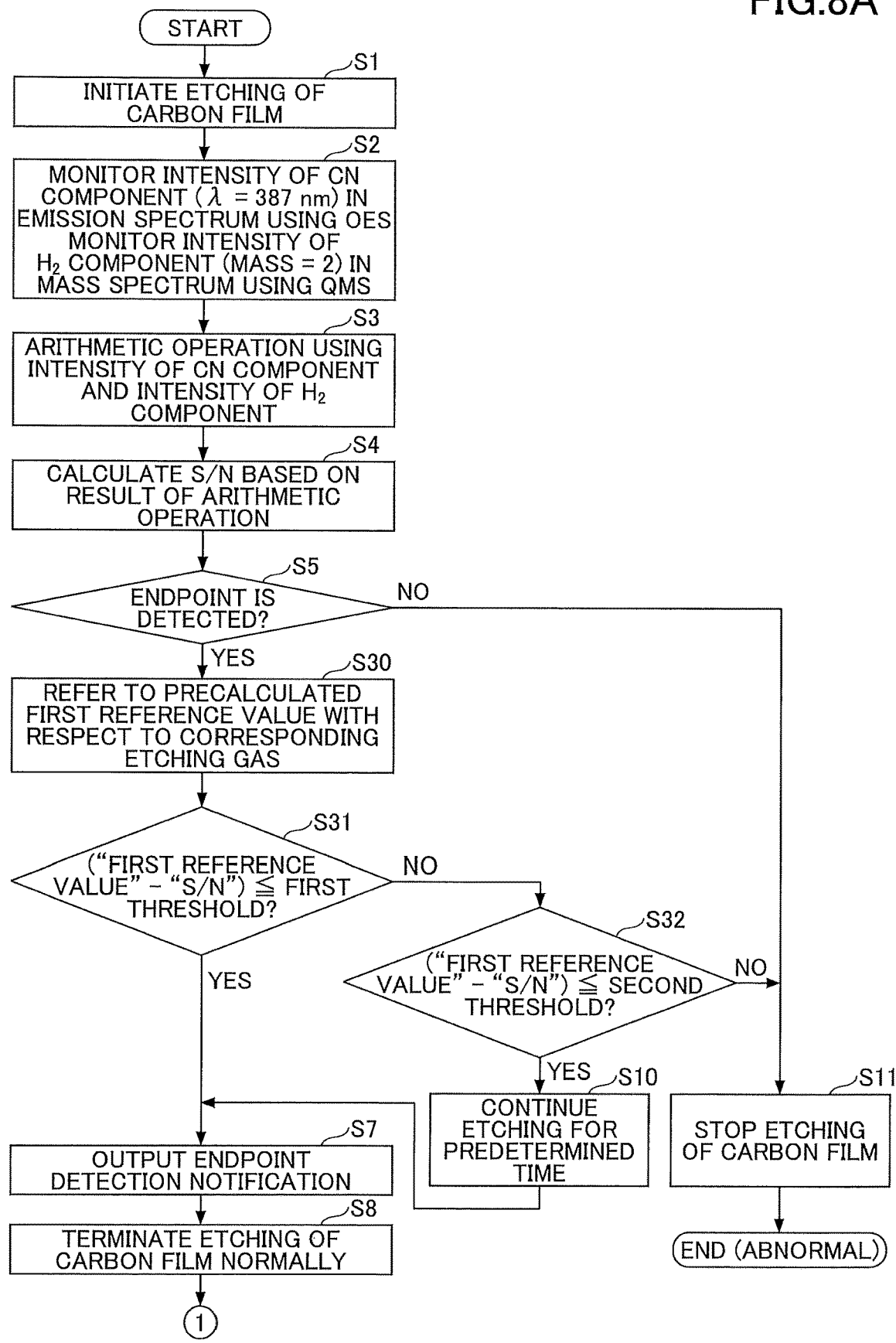
FIGS. 8A and 8B are flowcharts illustrating an endpoint detecting process of a carbon film and an endpoint detecting process of a silicon oxide film according to a second embodiment.
Figure 8B:
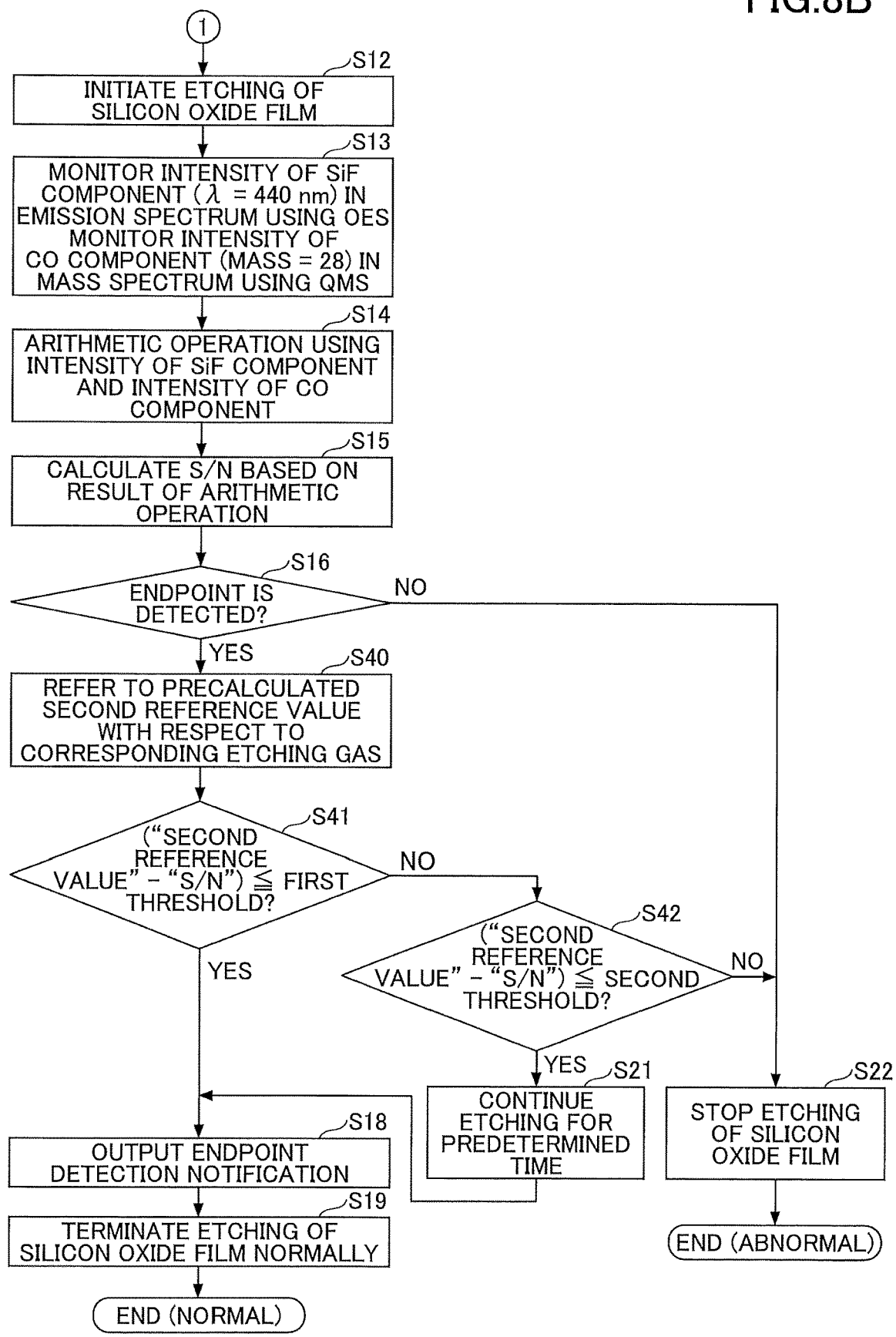

Next, a method of detecting an endpoint of a plasma process according to a second embodiment will be described with reference to FIG. 8A and FIG. 8B, which illustrate flowcharts of an endpoint detecting process with respect to a multilayered film illustrated in FIG. 2. FIG. 8A is a flowchart illustrating an endpoint detecting process of the carbon film according to the second embodiment. FIG. 8B is a flowchart illustrating an endpoint detecting process of a silicon oxide film according to the second embodiment. In the endpoint detecting method according to the second embodiment, the endpoint of the plasma processing is detected based on a reference value and a signal to noise ratio (i.e., S/N) of the signal obtained by the aforementioned arithmetic operation to noise. The reference value is predetermined, which is an S/N having been calculated from the signal when an endpoint of a plasma process (using the same process gas) has been detected. In addition, with respect to the same step as that in the endpoint detecting process of the carbon film or the endpoint detecting process of the silicon oxide film according to the first embodiment, the description of the step is simplified, and the same step number is assigned to the step.

[Endpoint Detection]

As illustrated in steps S1 to S5 of FIG. 8A, when etching of a film (carbon film 63) is started by using an etching gas set in a recipe, the endpoint detecting process of the film is performed. If it is determined at step S5 that an endpoint signal has been obtained, the detecting unit 103 refers to a first reference value stored in the storage unit 101 (step S30). The first reference value is a pre-calculated S/N, which has been calculated based on the signal when an endpoint of a plasma etching process, which has been performed by using the same process gas (etching gas) as that used in the etching of the carbon film 63 (performed at step S1), has been detected. Also, the first reference value is stored in the storage unit 101, in association with information of the process gas. In this manner, the pre-calculated first reference value is referenced based on a relationship between the signal when it is determined that an endpoint signal has been obtained in the past and the corresponding etching gas.

Next, at step S31, the detecting unit 103 determines whether or not a difference between the first reference value and the S/N calculated at step S4 is equal to or less than a first threshold. The first threshold may be set to 10% for example, or may be set to another value. If it is determined that the difference between the first reference value and the S/N is equal to or less than the first threshold, the detecting unit 103 outputs an endpoint detection notification (step S7), terminates the etching process of the carbon film 63 normally (step S8), and the endpoint detecting process proceeds to a process of etching the silicon oxide film 62 (step S12 and thereafter in FIG. 8B).

Meanwhile, if it is determined at step S31 that the difference between the first reference value and the S/N is greater than the first threshold, the detecting unit 103 determines whether the difference between the first reference value and the S/N is equal to or less than a second threshold (step S32). The second threshold is set to a value greater than the first threshold. For example, the second threshold may be set to 15%, or may be set to another value. If it is determined that the difference between the first reference value and the S/N is equal to or less than the second threshold, the detecting unit 103 continues etching of the carbon film 63 for a predetermined period of time (step S10), and outputs the endpoint detection notification (step S7). After the etching of the carbon film 63 is terminated normally (step S8), the endpoint detecting process proceeds to the process of etching the silicon oxide film 62 (step S12 and thereafter in FIG. 8B).

If it is determined at step S32 that the difference between the first reference value and the S/N is greater than the second threshold, the endpoint detecting process proceeds to step S11 to stop etching the carbon film 63, and the endpoint detecting process terminates abnormally.

Next, steps S12 to S16 in FIG. 8B are performed. If it is determined at step S16 that an endpoint signal has been obtained, the detecting unit 103 refers to a second reference value stored in the storage unit 101 (step S40). The second reference value is pre-calculated S/N, which has been calculated based on the signal when an endpoint of a plasma etching process, which has been performed by using the same process gas (etching gas) as that used in the etching of the carbon film 63 (step S12), has been detected. Also, the second reference value is stored in the storage unit 101, in association with information of the process gas. In this manner, the second pre-calculated reference value is referenced from the relationship between the signal when it is determined that an endpoint signal has been obtained in the past and the corresponding etching gas.

Next, at step S41, the detecting unit 103 determines whether a difference between the second reference value and the S/N calculated at step S15 is equal to or less than a first threshold. For example, the first threshold may be set to 10% or another value. If it is determined that the difference between the second reference value and the S/N is equal to or less than the first threshold, the detecting unit 103 outputs the endpoint detection notification (step S18), terminates the etching process of the silicon oxide film 62 normally (step S19), and the endpoint detecting process terminates.

Meanwhile, at step S41, if it is determined that the difference between the second reference value and the S/N is greater than the first threshold, the detecting unit 103 determines whether the difference between the second reference value and the S/N is equal to or less than a second threshold (step S42). The second threshold is set to a value greater than the first threshold. For example, the second threshold may be set to 15%, or may be set to another value. If it is determined that the difference between the second reference value and the S/N is equal to or less than the second threshold, the detecting unit 103 continues etching of the silicon oxide film 62 for a predetermined period of time (step S21), and outputs the endpoint detection notification (step S18). After the etching of the silicon oxide film 62 is terminated normally (step S19), the endpoint detecting process terminates.

If it is determined at step S42 that the difference between the second reference value and the S/N is greater than the second threshold, the endpoint detecting process proceeds to step S22 to stop etching the silicon oxide film 62, and the endpoint detecting process terminates abnormally.

Similar to the first embodiment, in the endpoint detecting method according to the second embodiment described here, S/N of a signal used for endpoint detection is improved by calculating two types of information: intensity of an emission spectrum and intensity of a mass spectrum. In addition, the determination of the present endpoint detection is made based on data obtained at a time of past endpoint detection. Thus, similar to the first embodiment, accuracy of endpoint detection can be improved in the second embodiment. For example, in the present embodiment, by improving the accuracy of endpoint detection in successive etching of multiple films, it is possible to prevent an etching defect of an opening and to perform etching of multiple films successively.

The endpoint detecting method and endpoint detecting apparatus according to each embodiment disclosed herein are to be considered exemplary in all respects, and are not restrictive. The above embodiments may be modified and enhanced in various forms without departing from the appended claims and spirit thereof. Matters described in the above embodiments may take other configurations to the extent not inconsistent, and may be combined to the extent not inconsistent.

A film to which the endpoint detection method according to each embodiment is applied is not limited to a multilayered film consisting of two types of films, but may be a multilayered film consisting of more than two types of films. Also, the film may be a multilayered film formed by stacking two or more types of films alternately. Alternatively, a film is not required to be a multilayered film, but may be a film of a single layer.

The plasma processing apparatus according to the present disclosure may be of any type, such as a capacitively coupled plasma (CCP) type, an inductively coupled plasma (ICP) type, a radial line slot antenna (RLSA) type, an electron cyclotron resonance plasma (ECR) type, and a helicon wave plasma (HWP) type.

In the present specification, a wafer W has been described as an example of a substrate. However, the substrate is not limited to a wafer W. Examples of the substrate may include various types of substrates used in a FPD (Flat Panel Display), a printed circuit board, and the like.

What is claimed is:

1. A method of detecting an endpoint of a plasma process performed in a plasma processing apparatus including a processing vessel;

an optical emission spectrometer configured to monitor intensity of a predetermined wavelength component in an emission spectrum by optical emission spectroscopy;

a mass spectrometer configured to monitor intensity of a predetermined component in a mass spectrum by mass spectrometry; and a controller including a central processing unit (CPU) and a memory storing a computer program; wherein the method comprises:

a) monitoring, by the optical emission spectrometer, the intensity of the predetermined wavelength component in the emission spectrum;

b) monitoring, by the mass spectrometer, the intensity of the predetermined component in the mass spectrum;

c) calculating, by the CPU, a signal by calculating a product of the monitored intensity of the predetermined wavelength component in the emission spectrum and the monitored intensity of the predetermined component in the mass spectrum;

d) repeating a) to c) until an amount of change of the signal within a predetermined time is within a prescribed amount;

e) calculating a signal to noise ratio (S/N) of the signal;

f) determining whether a difference between a predetermined reference value and the S/N is equal to or smaller than a first threshold; and g) in response to determining that the difference is equal to or smaller than the first threshold, starting another plasma process.

2. The method according to claim 1, further comprising, before a), providing the substrate on which a film is formed, the film being formed by stacking at least two types of films.

3. The method according to claim 1, further comprising h) in response to determining that the difference between the predetermined reference value and the S/N is greater than the first threshold and is equal to or smaller than a second threshold greater than the first threshold, starting another plasma process after continuing the plasma process for a predetermined period.

4. The method according to claim 3, further comprising:

i) stopping the plasma process in response to determining that the difference between the predetermined reference value and the S/N is greater than the second threshold.

5. The method according to claim 1, wherein the plasma process is performed by using a given gas; and the reference value is determined based on an S/N of a signal that was calculated when detection of an endpoint of a plasma process using the given gas was previously performed.

6. An endpoint detecting apparatus for detecting an endpoint of a plasma process applied to a substrate, the endpoint detecting apparatus comprising:

an optical emission spectrometer configured to monitor intensity of a predetermined wavelength component in an emission spectrum by optical emission spectroscopy;

a mass spectrometer configured to monitor intensity of a predetermined component in a mass spectrum by mass spectrometry; and a controller including a central processing unit (CPU) and a memory storing a computer program that causes the CPU to perform processes including a) monitoring, by the optical emission spectrometer, the intensity of the predetermined wavelength component in the emission spectrum;

b) monitoring, by the mass spectrometer, the intensity of the predetermined component in the mass spectrum;

c) calculating, by the CPU, a signal by calculating a product of the monitored intensity of the predetermined wavelength component in the emission spectrum and the monitored intensity of the predetermined component in the mass spectrum;

d) repeating a) to c) until an amount of change of the signal within a predetermined time is within a prescribed amount;

e) calculating a signal to noise ratio (S/N) of the signal;

f) determining whether a difference between a predetermined reference value and the S/N is equal to or smaller than a first threshold; and g) in response to determining that the difference is equal to or smaller than the first threshold, starting another plasma process.

* * * * *